United States Patent
Ueno et al.

(10) Patent No.: US 6,853,134 B2
(45) Date of Patent: Feb. 8, 2005

(54) ANODE STRUCTURE FOR ORGANIC LIGHT EMITTING DEVICE

(75) Inventors: Kazunori Ueno, Ebina (JP); Xiao-Chang Charles Li, Union City, CA (US); Sven Andresen, Kanagawa (JP); Koichi Suzuki, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 17 days.

(21) Appl. No.: 10/441,102

(22) Filed: May 20, 2003

(65) Prior Publication Data

US 2004/0232827 A1 Nov. 25, 2004

(51) Int. Cl.$^7$ ................................................. H01J 1/62
(52) U.S. Cl. ..................................... 313/506; 313/503
(58) Field of Search ............................... 313/498, 503, 313/506, 509

(56) References Cited

U.S. PATENT DOCUMENTS

| | | | |
|---|---|---|---|
| 5,834,893 A | 11/1998 | Bulovic et al. | 313/506 |
| 5,840,217 A | 11/1998 | Lupo et al. | 252/583 |
| 5,900,327 A * | 5/1999 | Pei et al. | 428/690 |
| 5,929,474 A | 7/1999 | Huang et al. | 257/292 |
| 5,998,803 A | 12/1999 | Forrest et al. | 257/40 |
| 5,998,805 A | 12/1999 | Shi et al. | 257/40 |
| 6,030,700 A | 2/2000 | Forrest et al. | 428/336 |
| 6,048,623 A | 4/2000 | Everhart et al. | 428/464 |
| 6,133,581 A | 10/2000 | Terao et al. | 257/40 |
| 6,208,075 B1 | 3/2001 | Hung et al. | 313/504 |
| 6,210,817 B1 | 4/2001 | Igarashi | 428/690 |
| 6,262,441 B1 | 7/2001 | Böhler et al. | 257/103 |
| 6,264,805 B1 | 7/2001 | Forrest et al. | 204/192.26 |
| 6,297,516 B1 | 10/2001 | Forrest et al. | 257/40 |
| 6,753,098 B2 * | 6/2004 | Aziz et al. | 428/690 |

OTHER PUBLICATIONS

"Organic electroluminescent devices with improved stability," S. A. Van Slyke, et al., Appl. Phys. Lett. (1996), vol. 69, pp. 2160–2163.

"Evaporated Sn–doped $In_2O_3$ films: Basic optical properties and applications to energy–efficient windows," I. Hamberg, et al., Journal of Applied Physics (1986), vol. 60, pp. R123–R159.

"Indium–tin oxide treatments for single– and double–layer polymeric light–emitting diodes: The relation between the anode physical, chemical, and morphological properties and the device performance," J. S. Kim, et al., Journal of Applied Physics (1998), vol. 84, pp. 6859–6870.

"Recent Developments In Molecular Organic Electroluminescent Materials," C. H. Chen et al., Macromol. Symp. (1998), vol. 125, pp. 1–48.

* cited by examiner

*Primary Examiner*—Vip Patel
(74) *Attorney, Agent, or Firm*—Fitzpatrick, Cella, Harper & Scinto

(57) ABSTRACT

An organic light emitting device (OLED) in which an anode includes a gold or gold composition layer under a thin layer of thiol or thiol-derivative. Preferably, the thin layer of thiol or thiol derivative is a self-assembled monolayer so as to enhance interface properties with other layers (such as a hole transporting layer) in the OLED.

12 Claims, 1 Drawing Sheet

| | |
|---|---|
| cathode | 108 |
| electron transporting layer | 107 |
| emissive layer | 106 |
| hole transporting layer | 105 |
| thiol-based layer | 104 |
| gold or gold composition layer | 103 |
| electrode | 102 |
| substrate | 101 |

| | |
|---|---|
| cathode | 207 |
| electron transporting layer | 206 |
| emissive layer | 205 |
| hole transporting layer | 204 |
| thiol-based layer | 203 |
| gold or gold composition layer | 202 |
| substrate | 201 |

FIGURE 1

| | |
|---|---|
| cathode | 108 |
| electron transporting layer | 107 |
| emissive layer | 106 |
| hole transporting layer | 105 |
| thiol-based layer | 104 |
| gold or gold composition layer | 103 |
| electrode | 102 |
| substrate | 101 |

FIGURE 2

| | |
|---|---|
| cathode | 207 |
| electron transporting layer | 206 |
| emissive layer | 205 |
| hole transporting layer | 204 |
| thiol-based layer | 203 |
| gold or gold composition layer | 202 |
| substrate | 201 |

ANODE STRUCTURE FOR ORGANIC LIGHT EMITTING DEVICE

BACKGROUND OF THE INVENTION

1. Field of the Invention

The present invention relates to an organic light emitting device (OLED) in which the anode includes a layer of gold or gold composition under a thin layer of a functional charge transporting thiol or thiol derivative.

2. Description of the Related Art

Significant efforts have been expended in developing suitable materials for use in organic light emitting devices (OLEDs). Such devices are commercially attractive because they offer the promise of low-cost fabrication of high-density pixeled displays exhibiting bright electroluminescence with long life times and wide color range.

A typical OLED is fabricated by sandwiching an emissive layer between an anode and a cathode. When a bias is applied across the electrodes, holes and electrons are respectively injected from the anode and cathode into the emissive layer, typically facilitated by hole transport and electron transport layers adjacent to the respective electrodes. The holes and electrons radiatively combine in the emissive layer and emit light. Improved performance can be obtained if blocking layers are provided to block against the injection of either holes or electrons from the adjoining layer and their subsequent escape from the device. Some of these layers can be combined. For example, a double-layered structure is fabricated from a combined hole-injecting and transporting layer together with a combined electron-transporting and light-emitting layer. Likewise, a triple-layered structure is composed of a hole-injecting and transporting layer, a light-emitting layer, and an electron-injecting and transporting, layer.

Light emission from the emissive layer must be emitted from the OLED to be visible, and at least one of the anode and cathode must therefore be sufficiently transparent in the visible light range (a visible light emission transparency greater than 60%). Indium tin oxide-coated glass (herein after "ITO-coated glass") is usually used as the anode, based on its good conductivity, high transparency (larger than 90% at 550 nm), and high work function (around 4.8 eV) which allows good hole injection. Its electrical properties have been described in many references (such as I. Hamberg and C. G. Granqvist, J. Appl. Phys., 60, R123 (1986)).

Despite its widespread use, ITO-coated glass has its drawbacks. For example, there is often a large variation in composition (that is, the ratio of tin oxide to indium oxide). This variation in composition may introduce variations in work functions and actually form barriers to hole injection rather than facilitating it. ITO-coated glass also is sensitive to electrochemical changes under high electrical fields which are ordinarily present during use of the OLED, and sometimes present during its fabrication. The ITO surface is often rough, since it is formed by sputtering and is subject to various surface physical changes by processing and fabrication steps such as cleaning, drying, and plasma/oxygen cleaning.

Because of these and other drawbacks, the prior art has investigated various modifications to ITO-coated glass. One group has investigated a modification through the incorporation of a thin layer of phthalocyanines (around 15 nm thick) in contact with the ITO (S. A. Van Slyke, C. H. Chen and C. W. Tang, Appl. Phys. Lett., 69, 2160 (1996)). Another group has investigated the treatment of ITO with a conducting polymer such as poly(3,4-ethylene dioxythiophene) (PEDOT) (see J. Appl. Phys., 84 (12), 6859 (1998)).

Still other approaches have focused on the hole transporting layer that often accompanies OLEDs, and various organic hole transporting compounds have been used to enhance the effect of the ITO-coated glass anode. However, because an interface is necessarily formed between the ITO and the organic hole transporting layer, other disadvantages might result, such as the formation of voids and a breakdown in the interface. In addition, for top-emission OLEDs (that is, OLEDs in which light is emitted through the cathode rather than the anode), the hole transporting layer is unable to assist in reflection of light to the anode.

SUMMARY OF THE INVENTION

The present invention has been made in consideration of the disadvantages of prior art anodes for OLEDs.

Briefly, according to the invention, an anode for an OLED is constructed from gold or gold composition under a thin layer of a charge transporting functional unit composed of thiol or thiol derivatives. The gold layer can be deposited on any suitable substrate, but preferably it is deposited on ITO-coated glass or co-sputtered with ITO on a substrate. Gold is preferred because of its high work function (around 4.8 eV) and its high reflectivity even in thin layers, or transparency in extremely thin layer. Use of gold together with ITO is preferred because their match in high work functions facilitates hole injection.

Preferably, the gold or gold composition layer is thin (from 0.5 nm to 100 nm). For OLEDs in which visible light emission is through the gold anode, the gold or gold composition layer should be extremely thin so as to be transparent to visible light. Preferably, for these type of OLEDs, the gold or gold composition layer has a thickness of 1 nm or less. A 1 nm gold layer has a transparency of approximately 93.4%. For top-emission OLEDs, the cathode is transparent and the gold layer should be thick enough to provide a reflective back surface for enhancement of top emission light density. Preferably, for these top-emission OLEDs, the gold or gold composition layer has a thickness of greater than 15 nm. A 15 nm gold layer provides approximately 11.9% reflection.

The functional charge transporting group of thiol or thiol derivatives is preferably a self-assembling mono-layer coated on the gold layer, and is included to enhance interface properties, particularly when a hole transporting layer is also used. Suitable thiol derivatives include ethane thiol and methylene thiol. Representative arrangements are shown in Schemes (I) or (II), as follows:

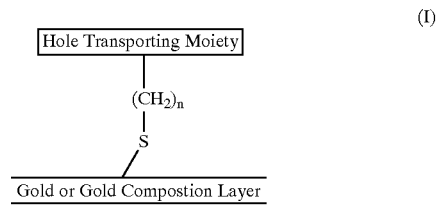

(I)

-continued

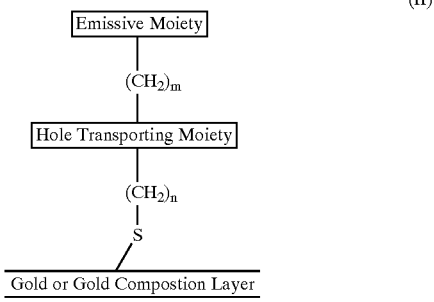
(II)

In Schemes (I) and (II), a hole transporting moiety is chemically bonded to the gold or gold composition layer via alkyl thiol. As a result, interface properties between the gold or gold composition layer and a hole transporting layer comprising the hole transporting moiety are enhanced, thereby facilitating the movement of charge from the gold or gold composition layer to the hole transporting layer.

In Scheme (II), the hole transporting moiety is also chemically bonded to an emissive moiety. As a result, interface properties between a hole transporting layer comprising the hole transporting moiety and an emissive layer comprising the emissive moiety are enhanced, thereby facilitating the movement of charge from the hole transporting layer to the emissive layer.

This brief summary has been provided so that the nature of the invention may be understood quickly. A more complete understanding of the invention can be obtained by reference to the following detailed description of the preferred embodiments thereof in connection with the attached drawings.

BRIEF DESCRIPTION OF THE DRAWINGS

FIGS. 1 and 2 are schematic cross-sectional views of OLEDs according to the invention.

DETAILED DESCRIPTION OF PREFERRED EMBODIMENTS

Thus, the present invention provides for an OLED in which the anode includes a layer of gold or gold composition under a thin layer of a functional charge transporting thiol or thiol derivative. Preferably, the thin layer is a self-assembling film such as a mono-layer formed by chemical bonding between gold and thiol.

FIG. 1 schematically depicts an OLED according to the invention, including substrate 101, electrode 102, gold or gold composition layer 103, thiol-based layer 104, hole transporting layer 105, emissive layer 106, electron transporting layer 107, and cathode 108.

The substrate 101 may be comprised of glass, quartz and the like, and polymers (including, without limitation, polyesters, polycarbonates, polyacrylates, polymethacrylates, and polysulfones). Glass is preferred. The thickness of the substrate 101 is not critical and can range, for example, from 25 to over 1,000 microns.

Electrode 102 adjacent the substrate 101 can be comprised of an alloy, an electroconducting compound, or mixtures thereof, especially with a work function equal to, or greater than about 4 electron volts. Specific examples include indium tin oxide (ITO), tin oxide, zinc oxide, electrically conductive carbon, and conjugated polymers such as polyaniline, polypyrrole, and the like. ITO is preferred. The thickness of the electrode layer can range anywhere from about 10 nm to 1 micron.

The gold or gold composition layer 103 contains gold, and is preferably thin (from 0.5 nm to 100 nm). Gold sputtered onto an electrode 102 containing ITO is preferred. If desired, gold may be co-sputtered with ITO onto electrode 102.

Electrode 102 and the gold or gold composition layer 103 make up the anode of the OLED. If the OLED is one in which light is emitted through the anode, the substrate 101, electrode 102, and the gold or gold composition layer 103 are transparent to visible light.

The thiol-based layer 104 comprises a charge transporting functional unit which includes thiol or thiol derivatives. The thiol-based layer 104 is thin, and preferably comprises a self-assembling film such as a mono-layer formed by chemical bonding between gold in layer 103 and thiol.

The hole transporting layer 105 may be comprised of any material which can inject and transport holes into the emissive layer. Usually, the thickness of the hole transporting layer 105 ranges from 0.2 nm to 50 nm or more. Well known hole transport materials include N,N'-diphenyl-N,N'-bis(3-methylphenyl)(1,1'-biphenyl)4,4'-diamine (TPD), N,N,N',N'-tetrakis(4-methylphenyl)(1,1'-biphenyl)-4,4'-diamine (TTB), and N,N'-bis-(1-naphthyl)-N,N'-diphenyl-1,1'-biphenyl-4,4'-diamine (NPB), which are widely used in current OLED research. However, the invention is not limited to the use of these materials.

The hole transporting layer 105 may comprise a hole transporting moiety which is chemically bonded to thiol in the thiol-based layer 104, as shown in Schemes (I) and (II) above.

Suitable materials for the emissive layer 106 include the materials heretofore described in the art as being useful for this purpose, including without limitation the materials described in B. R. Hsieh, Ed., "Organic Light-Emitting Materials and Devices," *Macromolecular Symposia*, Vol. 125, pp. 1–48 (January, 1998), which is herein incorporated by reference. However, the invention is not limited to the use of these materials. The emissive layer 106 may have a thickness in the range of 1 nm to 1000 nm or more.

The emissive layer 106 may comprise an emissive moiety which is chemically bonded to a hole transporting moiety in the hole transporting layer 105, as shown in Scheme (II) above.

The electron transport layer 107 may be selected from the many suitable materials known in the art. The best known electron transport materials are metal chelates such as $AlQ_3$, and $BeBq_2$, 1,3,4-oxiazole derivatives (OXDs) such as PBD, and 1,2,4-triazoles (TAZs). However, the invention is not limited to the use of these materials. Usually, the thickness of the electron transport layer ranges from 1 nm to 1000 nm or more.

Evaporated metal films are generally used for the cathode 108. Aluminum, lithium, magnesium, calcium, and other low work function materials are particularly preferred. In a top-emission device, the cathode 108 is sufficiently thin to be transparent to visible light.

In a procedure for fabricating the OLED shown in FIG. 1, the substrate 101 having electrode 102 and gold or gold composition layer 103 patterned thereon is treated with $O_2$ plasma for 1 to 5 minutes. The assembly is thereafter placed in a vacuum deposition chamber and the pressure is reduced to approximately $6 \times 10^6$ torr. The layers 104 to 108 are deposited by vacuum deposition, after which the vacuum deposition chamber is allowed to cool. Upon application of a forward bias, luminescent emission is observed.

The invention is not limited to the use of the above procedure. For example, layers 104 to 108 can be deposited by methods such as solution dip coating or spin coating.

FIG. 2 schematically depicts an OLED according to a second embodiment of the invention, including substrate 201, gold or gold composition layer 202, thiol-based layer 203, hole transporting layer 204, emissive layer 205, electron transporting layer 206, and cathode 207. The FIG. 2 embodiment differs from that of FIG. 1 primarily in the elimination of the electrode, with the gold or gold composition layer 202 being the anode of the OLED.

Suitable materials for the substrate 201 include glass, quartz and the like, and polymers (including, without limitation, polyesters, polycarbonates, polyacrylates, polymethacrylates, and polysulfones). Glass is preferred. The thickness of the substrate 201 is not critical and can range, for example, from 25 to over 1,000 microns.

The gold or gold composition layer 202 comprises a composite of gold and a positive charging electrode such as indium tin oxide (ITO), tin oxide, zinc oxide, electrically conductive carbon, and conjugated polymers such as polyaniline, polypyrrole, and the like. A composite of ITO and gold is preferred, with the composition ratio of ITO/gold being within the range of from 0.01 to 0.995. The ITO/gold composite may be formed by co-sputtering gold with ITO onto the substrate 201. Pure gold may be used if desired.

If the OLED is one in which light is emitted through the anode, then the substrate 201 and the gold or gold composition layer 202 are transparent to visible light.

The thiol-based layer 203 comprises a charge transporting functional unit which includes thiol or thiol derivatives. The thiol-based layer 203 is thin, and preferably comprises a self-assembling mono-layer.

The hole transporting layer 204 may be comprised of any material which can inject and transport holes into the emissive layer. Usually, the thickness of the hole transporting layer 204 ranges from 0.2 nm to 50 nm or more. Well known hole transporting materials include N,N'-diphenyl-N,N'-bis(3-methylphenyl)(1'-biphenyl) 4,4'-diamine (TPD), N,N,N',N'-tetrakis (4-methylphenyl)(1,1'-biphenyl)-4,4'-diamine (TTB), and N,N'-bis-(1-naphthyl)-N,N'-diphenyl-1, 1'-biphenyl-4,4'-diamine (NPB), which are widely used in current OLED research. However, the invention is not limited to the use of these materials.

The hole transporting layer 204 may comprise a hole transporting moiety which is chemically bonded to thiol in the thiol-based layer 204, as shown in Schemes (I) and (II) above.

Suitable materials for the emissive layer 205 include the materials heretofore described in the art as being useful for this purpose, including without limitation the materials described in B. R. Hsich, Ed., "Organic Light-Emitting Materials and Devices," *Macromolecular Symposia*, Vol. 125, pp. 1–48 (January, 1998), which is herein incorporated by reference. However, the invention is not limited to the use of these materials. The emissive layer 205 may have a thickness in the range of 1 nm to 1000 nm or more.

The emissive layer 205 may comprise an emissive moiety which is chemically bonded to a hole transporting moiety in the hole transporting layer 204, as shown in Scheme (II) above.

The electron transporting layer 206 may be selected from the many suitable materials known in the art. The best known electron transporting materials are metal chelates such as $AlQ_3$, and $BeBq_2$, 1,3,4-oxiazole derivatives (OXDs) such as PBD, and 1,2,4-triazoles (TAZs). However, the invention is not limited to the use of these materials. Usually, the thickness of the electron transporting layer ranges from 1 nm to 1000 nm or more.

Evaporated metal films are generally used for the cathode 207. Aluminum, lithium, magnesium, calcium, and other low work function materials are particularly preferred. In a top-emission device, the cathode 207 is sufficiently thin to be transparent to visible light.

In a procedure for fabricating the OLED shown in FIG. 2, the substrate 201 having the gold or gold composition layer 202 patterned thereon is treated with $O_2$ plasma for 1 to 5 minutes. The assembly is thereafter placed in a vacuum deposition chamber and the pressure is reduced to approximately $6 \times 10^6$ torr. The layers 203 to 207 are deposited by vacuum deposition, after which the vacuum deposition chamber is allowed to cool. Upon application of a forward bias, luminescent emission is observed.

The invention is not limited to the above procedure. For example, the various layers 203 to 207 can be deposited by methods such as solution dip coating and spin coating.

The invention has been described with particular illustrative embodiments. It is to be understood that the invention is not limited to the above-described embodiments and that various changes and modifications may be made by those of ordinary skill in the art without departing from the spirit and scope of the invention.

What is claimed is:

1. An organic light emitting device comprising:
   an organic emissive layer between at least a cathode and an anode;
   wherein said anode includes a thin metallic layer containing gold under a thin thiol-based layer of a charge transporting functional unit composed of thiol or thiol derivatives.

2. An organic light emitting device according to claim 1, wherein said thin metallic layer comprises gold deposited on a substrate.

3. An organic light emitting device according to claim 2, wherein said substrate comprises ITO-coated glass.

4. An organic light emitting device according to claim 1, wherein said metallic layer comprises gold co-sputtered with ITO on a substrate.

5. An organic light emitting device according to claim 1, wherein said OLED emits light through said anode, and wherein said metallic layer is sufficiently thin so as to be transparent to visible light.

6. An organic light emitting device according to claim 1, wherein said OLED emits light through said cathode, said cathode is transparent, and said metallic layer is sufficiently thick to provide a reflective back surface.

7. An organic light emitting device according to claim 1, wherein said thiol-based layer comprises a self-assembling mono-layer coated on said metallic layer.

8. An organic light emitting device according to claim 7, further comprising a hole transporting layer between said thiol-based layer and said emissive layer.

9. An organic light emitting device according to claim 8, wherein said hole transporting layer has a thickness of 0.2 nm to 50 nm.

10. An organic light emitting device according to claim 8, wherein said hole transporting layer comprises a hole transporting moiety which is chemically bonded to said thiol-based layer.

11. An organic light emitting device according to claim 10, wherein said emissive layer comprises an emissive moiety which is chemically bonded to said hole transporting moiety.

12. An organic light emitting device according to claim 8, wherein said thiol-based layer comprises ethane thiol or methylene thiol.

* * * * *

UNITED STATES PATENT AND TRADEMARK OFFICE
CERTIFICATE OF CORRECTION

PATENT NO.    : 6,853,134 B2
DATED         : February 8, 2005
INVENTOR(S)   : Kazunori Ueno et al.

It is certified that error appears in the above-identified patent and that said Letters Patent is hereby corrected as shown below:

Column 2,
Line 31, "layer" should read -- layers --.

Column 3,
Before line 15, -- where m, n = 0 to 20 -- should be inserted.

Column 5,
Line 50, "Hsich" should read -- Hsieh --.

Signed and Sealed this

Seventh Day of June, 2005

JON W. DUDAS
*Director of the United States Patent and Trademark Office*